US005586052A

United States Patent [19]
Iannuzzi et al.

[11] Patent Number: 5,586,052
[45] Date of Patent: Dec. 17, 1996

[54] RULE BASED APPARATUS AND METHOD FOR EVALUATING AN ENGINEERING DESIGN FOR CORRECTNESS AND COMPLETENESS

[75] Inventors: Mark P. Iannuzzi, Clinton Township; Timothy S. Owen, Troy; Colin A. Wearring, Birmingham; Jeffrey L. Wilson, Ray; John P. Hertrich, Lum, all of Mich.

[73] Assignee: Applied Computer Solutions, Inc., St. Clair Shores, Mich.

[21] Appl. No.: 53,714

[22] Filed: Apr. 27, 1993

[51] Int. Cl.$^6$ .................................................. G06F 17/50
[52] U.S. Cl. ............... 364/512; 364/468.03; 364/559; 364/560; 364/474.24; 395/919; 395/140
[58] Field of Search ................. 364/552, 559, 364/468, 560, 474, 474.24, 474.26, 512, 488; 395/919, 140

[56] References Cited

U.S. PATENT DOCUMENTS

| | | |
|---|---|---|
| 4,918,627 | 4/1990 | Garcia . |
| 5,208,763 | 5/1993 | Hong et al. ...................... 364/551.02 |

OTHER PUBLICATIONS

Fleming, A. "Geometric Relationships between Tolerance & Features"; Artificial Intelligence, V. 37/1–3/1988.
Clement, A. "The Resolution of Positioning Solids". Annals of the CIRP, vol. 40/Jan. 1991.
A. Clement et al.; "A Dimensioning and Tolerancing Assistance Model for CAD/CAM Systems"; Int. J. Adv Manf. Technol (1994).
Bernstein, N. S. and Preiss, K, *Representation of Tolerance Information in Solid Models* 1989, ASME Design Automation Conference, Sep. 17–21.
Clement, A., *Three–Dimensional Tolerancing of Mechanical Systems*: Theory and Practice, 1994.
Lee, Jinkoo, Tolerance Optimization Using Genetic Algorithm and Approximated Simulation, 1992.
Representation of Tolerance Information in Solid Materials, Proceedings of 1989 ASME Design Automation Conference, Montreal, Canada, Sep. 17–21, 1989, N. S. Bernstein and K. Preiss.

*Primary Examiner*—Emanuel T. Voeltz
*Assistant Examiner*—Kamini S. Shah
*Attorney, Agent, or Firm*—Harness, Dickey & Pierce

[57] ABSTRACT

An apparatus and method provides for the input of geometric data representing features of a manufactured part and data representing datums and tolerances for the features. Relationships are established between the data and degrees of freedom are determined for the part features and tolerances. The relationships and degrees of freedom are interpreted to determine if the tolerance plan defined by a designer is complete and well formed. If it is not, the designer may then revise the tolerancing plan to provide for a more consistent and useful tolerancing plan resulting in higher quality, lower cost manufactured parts and assemblies.

27 Claims, 5 Drawing Sheets

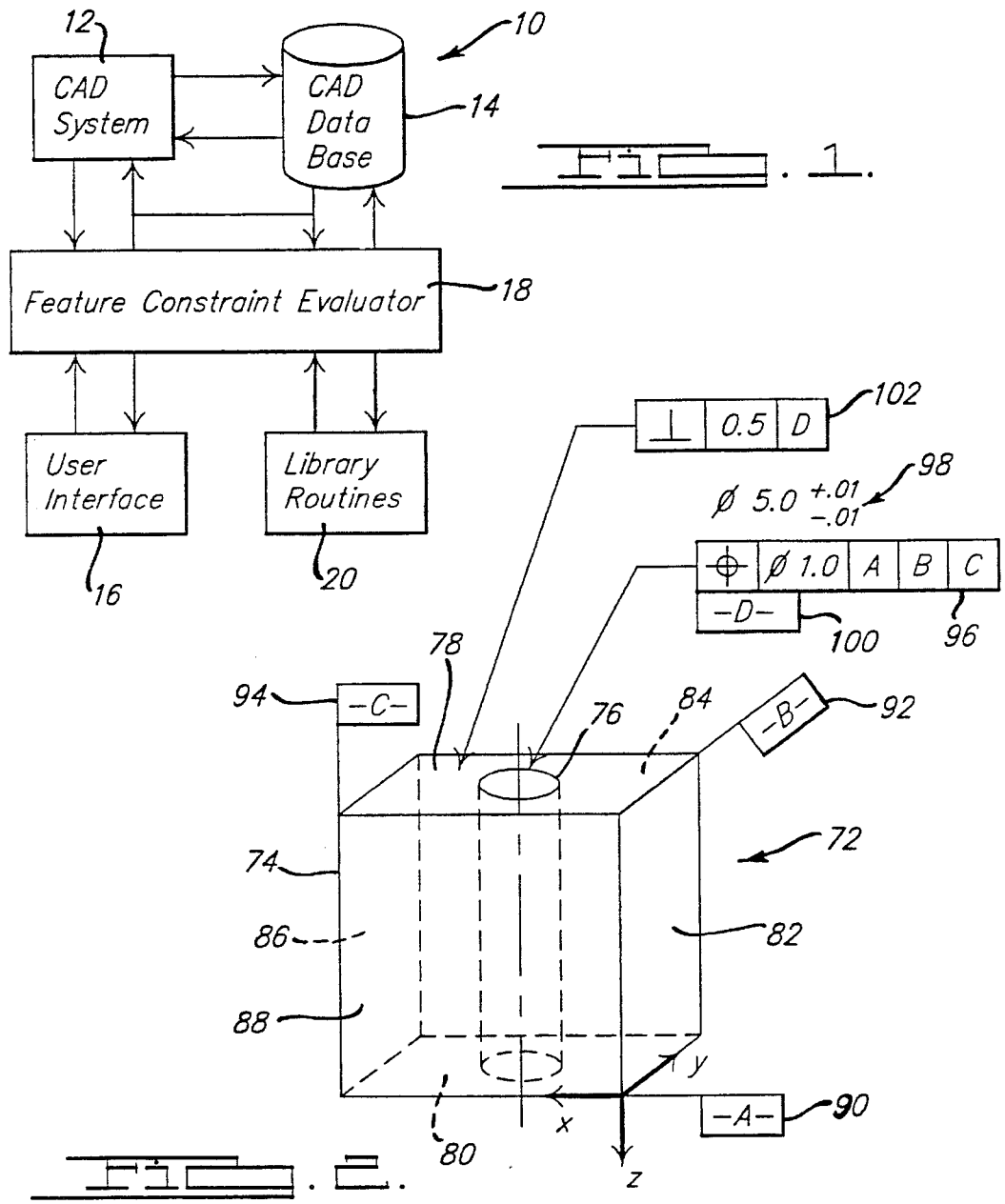
FIG. 1.
FIG. 2.
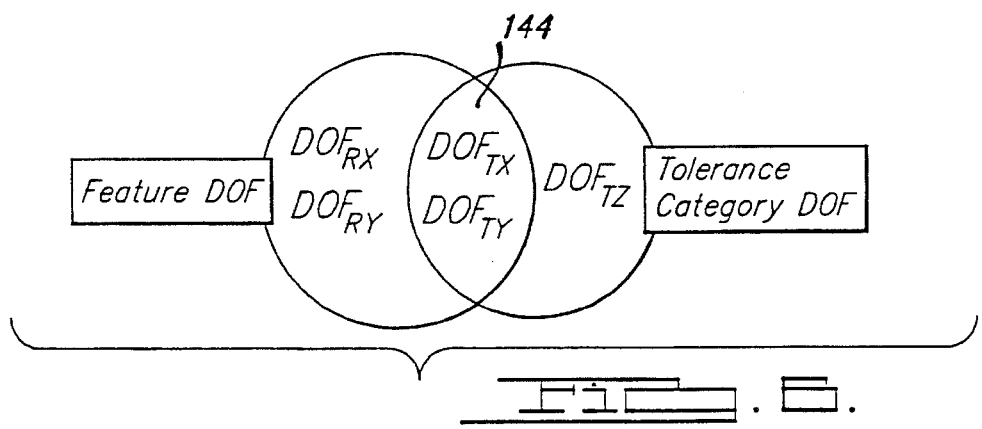
FIG. 3.

RULE BASED APPARATUS AND METHOD FOR EVALUATING AN ENGINEERING DESIGN FOR CORRECTNESS AND COMPLETENESS

BACKGROUND OF THE INVENTION

The present invention relates generally to part tolerancing and, more particularly, to an apparatus and method for analyzing the completeness and well formedness of tolerance constraints assigned to features of a subject part.

All manufactured products or parts are subject to variation of their various features, i.e., sufaces, holes, etc., as a result of the manufacturing processes used to create them. The variation in these features compounds as a result of bringing several manufactured parts together to make an assembly. Designers try to control variation by establishing a tolerance plan which specifies how much variation may exist on a particular part. Deficiencies in the tolerance plan, however, often do not become apparent until proto-type pads are constructed, checking fixtures and gages are designed or constructed, and/or pads are manufactured. At this time, changing the tolerance plan can delay production and increase cost. Failure to change the tolerance plan may lead to manufacturing inefficiencies, increased costs and reduced quality. Therefore, it is important to verify early on, while the parts are being designed, that the tolerance plan is well formed.

A difficulty with assigning tolerances to features on a part lies in the measuring of "what" from "where". Often the datum or reference feature from which a tolerance is defined has no relation to the feature being measured. For example, for a given part, an important relationship may be the location of a first feature with respect to a second feature on the pad. The datum, however, may be a third feature which has no importance to either of the two features. Unless the designer is sure to specify the appropriate starting point, the tolerance defined may not be useful. A typical, and unfortunate, reaction by the designer is to simply assign additional tolerances to the features in an attempt to control the important feature. Such practice usually results in inconsistent tolerances, that is, multiple tolerance assignments to a feature which can not physically coexist. In another, and equally unfortunate situation, the designer will not define any tolerances for the feature and thus an acceptable part based on manufacturing variation is not defined.

Thus it is important to have a well defined tolerance plan to identify for the manufacturer an acceptable range of variation for particular features of a part or assembly such that the part or assembly will function as intended. Rules for assigning these tolerances assist in this effort by providing a consistent interpretation of what the designer meant by a particular tolerance assignment. A typical set of rules is provided in the ANSI Y14.5M 1982 standard for Geometric Dimensioning and Tolerancing (GD&T). Unfortunately, even with a rather simple manufactured part, the number of features which may require tolerances can be significant, and the designer has to be assured that each of the tolerances assigned are meaningful, relate in an acceptable manner to each other, and most importantly, allow for the manufacture of a useful part.

The tolerance plan can further be thought of as measurement criteria. The tolerance plan defines what is being measured and from where it is being measured. In this regard, tolerance rules generally require definition of an initial feature or datum from which measurements originate. Based on the datum feature, other features of the part may be defined and measured. Since, however, not all features on a part are of like construction, the tolerance rules also provide for different types of measurements based on particular types of features. The tolerance rules also provide for assigning a magnitude of allowable variation for each of the features assigned a tolerance.

To assist in understanding tolerances it is useful to discuss the concepts of constraint and relaxation and degrees of freedom. These notions were discussed by Bernstein and Preiss in their article *Representation of Tolerance Information in Solid Models*, Advances In Design Automation, 1989 Proceedings of the 1989 ASME Design Automation Conference, Montreal, Canada, Sep. 17–21, 1989. In designing a part, a designer defines the requirements, for example, the physical dimensions for a mechanical part, in an exact sense. In manufacturing the part, the manufacturer tries to make parts as closely to these requirements as possible, but variation is inevitable. Thus a difficult task becomes defining how much variation is allowable such that the part still functions as intended. In this sense, the requirement or defined feature of the part, for example, the exact location of a hole or the orientation of a surface as specified by the designer, is considered a constraint, and the amount of allowable variation is a relaxation of that constraint.

Constraints are defined with reference to some fixed location and orientation, and under the rules of GD&T defined in the ANSI Y14.5M standard, this fixed location and orientation is called a datum reference frame, and the data used to define the part are called basic dimensions. More than one datum reference frame may exist on a part. Under one interpretation of the tolerance rules one of these datum reference frames is considered a master datum reference frame to which it is desirable to relate the other datum reference frames and features either directly or indirectly. Thus, the features of the part are defined or constrained in space relative to the datum reference frame by basic dimensions. Tolerances, similar to basic dimensions, define allowable amounts of variation for a particular feature with respect to the datum reference frame.

In a pure sense, both basic dimensions and tolerances are constraints because each place a restriction on a relationship of one feature with respect to another feature. Basic dimensions place a fixed constraint on the relationship, e.g., the position of surface "A" is a fixed number of millimeters away from surface "B" in the "X" direction. Tolerances place a variable constraint on the relationship, e.g., the position of surface "A" may vary plus or minus so many millimeters from surface "B" in the "X" direction. For consistency, basic dimensions are referred herein as constraints or constraining data and tolerances are referred to as relaxations or relaxing data. Also, if the tolerances for a particular feature are not properly defined, as specified by the tolerance rule base, it is considered either under-constrained or over-constrained.

Degrees of freedom help the understanding of how tolerances relax constraints in three dimensional space. For example, a cylinder representing a hole through the surface of a part is defined by certain fixed data which identify the location, orientation, size and form of the hole. Variation of some of this data effects the location and orientation of the feature. These are degrees of freedom of the feature. Tolerances permit but also define limits on the amount of variation of the fixed data. Thus the tolerances control the feature degrees of freedom. However, if a tolerance is not assigned, there are a number of possible interpretations. One interpretation is that the feature is perfect, that is, it must be assumed that there is no variation of the data defining the feature or no degrees of freedom. This further implies that there is no variation of this feature on the actual manufactured part, a condition which is not likely. Another interpretation is that large amounts of variation of the feature are acceptable or no control of the degrees of freedom. This, however, is only an assumption, and large amounts of variation may render the part useless.

SUMMARY OF THE INVENTION

Accordingly, an apparatus and method are disclosed in the present invention which provides for inputting geometric data representing features of a manufactured part and data representing datums and tolerances for the features, establishing relationships between the data and determining the degrees of freedom for part features and tolerances. The invention then interprets these relationships to determine if the tolerance plan defined by a designer is complete and well formed with respect to a given set of completeness and well formedness criteria. If it is not, the designer may then revise the tolerancing plan to provide for a more consistent and useful tolerancing plan resulting in higher quality, lower cost manufactured parts and assemblies.

An additional object of the present invention is to provide consistent and unambiguous evaluation of part design tolerance plans and to determine whether or not a particular tolerance plan has the potential to achieve its intent.

Another object of the present invention is to provide a designer with a system for evaluating part design tolerance plans using degrees of freedom to determine whether or not particular part features are adequately constrained and relaxed by the tolerance plan.

Still another object of the present invention is to provide a designer with a system for evaluating the tolerance plan for an entire component part through the construction of a feature constraint network linking datums, features and tolerances to ensure features are properly and unambiguously constrained to datums and relaxed by tolerances.

It is yet another object of the present invention to provide a designer with a system for evaluating tolerances as relaxed constraints on features of a part to assist the designer in determining whether the tolerance plan achieves its design intent.

An additional object of the present invention is to provide a designer with a system for evaluating tolerances which may be used on design data prior to the creation of prototype parts and checking devices.

And, still another object of the present invention is to provide a designer with a system for evaluating tolerances which is adaptable to any number of tolerance rule sets used to define the tolerance plan.

BRIEF DESCRIPTION OF THE DRAWINGS

These and other objects, advantages and features of the present invention will be more apparent from the following description and the accompanying drawings in which:

FIG. 1 is a block diagram representation of a computer system for use with the present invention;

FIG. 2 is a schematic representation of a subject part illustrating a tolerance plan for the defined features;

FIG. 6 is a schematic illustrating the interaction of features with tolerances in defining degrees of freedom;

DETAILED DESCRIPTION OF THE INVENTION

Figure 3:
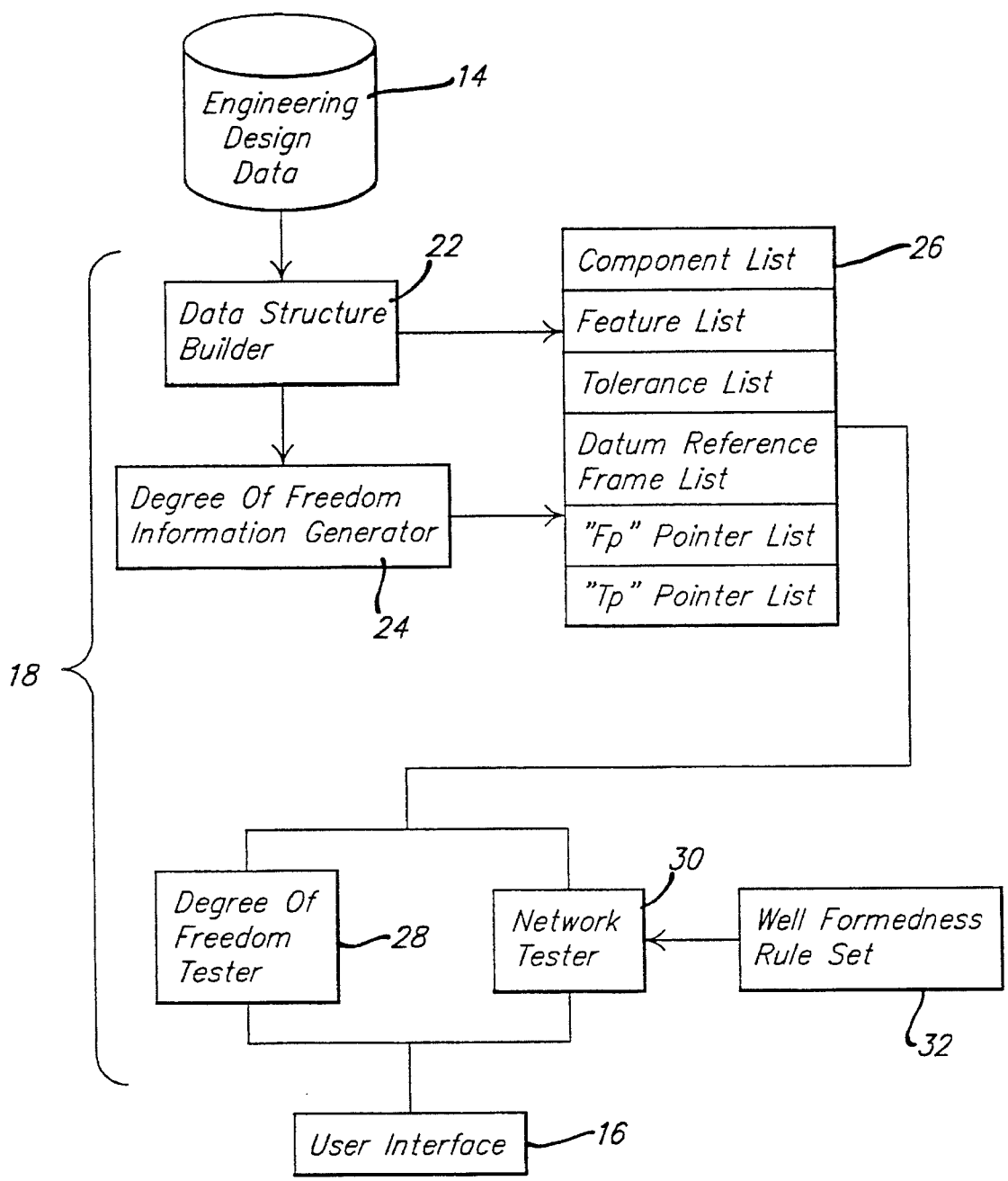
FIG. 3 is a schematic diagram of the elements of the feature constraint evaluator system of the present invention.

The present invention discloses an apparatus and method for evaluating the completeness and well formedness of a part tolerancing plan based on a predefined set of tolerance rules within a computer system 10. The invention provides for obtaining geometric data and tolerance data from a Computer Aided Design (CAD) system 12 and CAD database 14, and in response to user interaction with the computer system 10, provides feedback to the user as to the condition of the tolerance plan.

With reference to FIG. 1 of the drawings, a computer system 10 is shown and includes a CAD system 12 and a CAD database 14. A user interface 16 is provided whereby a user is able to interact with the system. In the preferred embodiment, user interface 16 may be a micro-computer system such as an IBM personal computer system or compatible type system or a mid-range workstation such as a Sun Sparc series, IBM RS 6000, or similar type computer workstation; the user interface 16 thereby including memory, processing and input/output capabilities. The user interface 16 is shown interacting with the feature constraint evaluator 18 which in turn interacts and communicates with the CAD System 12, CAD database 14 and library routines 20. The feature constraint evaluator 18 communicates with the CAD system 12 and CAD database 14 to obtain geometric and tolerance data stored therein via CAD database interface functions (db functions). The db functions include routines for retrieving a number of component parts defined by the features which create them from the CAD database. Included in the data retrieved is any identifying information such as component and feature names, descriptions, and types. The db functions also retrieve the unitized feature normal vectors and any derived feature information. Also retrieved from the CAD database via the db functions are the tolerances, whether or not they are tied to a particular feature, along with identifying information such as type, class, modifiers, the datum features which it references, and the feature(s) that it applies to. Depending on the particular CAD system, some processing of this data is required to connect various pieces of tolerance data with geometric or feature data. For example, in some CAD systems tolerance definitions are simply text notations within the CAD system. The tolerance data, therefore, must be associated with the features of the component part. For such systems, a method for completing a suitable conversion and association of the tolerance information to the geometric data is disclosed in U.S. Pat. No. 4,918,627 the disclosure of which is hereby expressly incorporated herein by reference.

Various other functions used in conjunction with the preferred embodiment of the present invention are also stored in a library of routines 20. Among these are feature constraint network interface functions (FCN functions) which include general functions for creating a feature constraint network by linking together the features and tolerances associated with a component. The library 20 also contains various utility functions to assist the user in manipulating data, generating output, performing file management and other functions.

Before giving a detailed description of the function of the preferred implementation, several terms as used throughout are defined. A feature is a term used to describe a physical portion of a part such as a surface, hole or slot. A feature of size, per the ANSI Y14.5m standard, is a single cylindrical or spherical surface or a set of two plane parallel opposing surfaces, each of which is associated with a size dimension. A derived feature describes a feature which is created from a group of preexisting features, such as a plane best fit through a series of point features, or a pattern derived from a group of holes. A compound feature is a slot or tab feature which is defined by identifying two parallel planes. A defined derived feature is a derived feature where all of the child features are contained on the same component part. An undefined derived feature is a derived feature where all of the child features are not contained on the same part. A datum is, theoretically, an exact point, axis, plane derived from the true geometric counterpart of a specified datum feature. A datum is the origin from which the location of geometric characteristics of features of a part are established. A datum feature is an actual feature of a part that is used to establish a datum. A feature control frame is a graphic representation of a geometric tolerance using geometric symbols, tolerance values, and datum reference letters where appropriate. A feature reference frame (FRF) is a local coordinate system which is created from feature points and is used to apply orientation, location and relational tolerances. The datum reference list is a list of datum features, generally referenced by letters, contained in the feature control frame and which create the datum reference frame. The datum reference frame (DRF) is a complete coordinate system defined by datum features, or the specified datum features and the global or world coordinate system if the datum features do not specify a complete coordinate system, to provide direction as well as an origin for related dimensions and measurements. A complete DRF controls all six spatial degrees of freedom. An incomplete DRF does not control all six spatial degrees of freedom. A defined DRF is a DRF created from the datum reference list with all datum features contained on the same component. An undefined DRF is a DRF for a component tolerance with datum features spanning several components. The master datum reference frame (MDRF) is a DRF identified as the reference frame with the highest precedence on the component. Precedence is established by a combination of well formedness criteria, precedence of datum feature letter references and precedence of feature identification. This DRF is used for basic dimensioning of features if it appears in the features tolerance callout list. A well formed MDRF is defined where the datum reference list defines a complete DRF and is composed of datum features toleranced only to other features in the master datum reference frame datum reference list. Auxiliary DRFs are DRFs created from features not contained in the master datum reference list, or from a reordering of the features in the master datum reference list. The world coordinate system is a fixed coordinate system, usually based upon the CAD system, which provides global reference for geometric and tolerance data.

Referring to FIGS. 1 and 3, the feature constraint evaluator 18 includes a data structure builder 22. Data structure builder functions to obtain the engineering design data from the CAD database 14. Data structure builder 22 then processes the data to create data structure 26. In the preferred embodiment, data structure 26 consists of a series of linked lists which are maintained for all components, features, and tolerances which exist in the FCN. An additional linked list of nodes is maintained for all unique datum reference frames (DRFs) specified by the tolerances. "Fp" and "Tp" nodes exist to point into these lists so that a component node owns a linked list of Fp pointers to the features residing on that component. Each feature owns a linked list of Tp pointers which point to the tolerances which are applied to that feature. Each feature also owns a linked list of Fp pointers which point to any subfeatures defining that feature. Each tolerance owns a linked list of Fp pointers which point back to the features which it is applied to. It also owns a single pointer to the DRF node containing its datum information. Each DRF node owns a linked list of Fp pointers to the datum features which make up the frame. Additional information in the DRF node clarifies which features are primary, secondary and tertiary datums and any modifiers to them. The contents of the linked lists and nodes is summarized in Table I.

TABLE I

| | DESCRIPTION OF LINKED LISTS | |
|---|---|---|
| List | Contents | Description |
| Component | Component ID | ID used to access component db information |
| | Info Slot | slot to hold arbitrary information |
| | First Feat Fp | pointer to first feature on component |
| | First DRF Fp | pointer to first DRF on component |
| | Next Comp Ptr | pointer to Next Component in FCN |
| Feature | Feature ID | ID used to access feature db information |
| | Info Slot | slot to hold arbitrary information |
| | Feat DOF | degrees of freedom table for feature |
| | Feat Ref Frame | feature's reference frame |
| | Datum Flag | TRUE if feature acts as datum |
| | Valid Flag | FALSE if this feature is invalid |
| | Warning Flags | TRUE for each invalid feature constraint |
| | First Subfeat Fp | pointer to first subfeature which makes up feature |
| | First Tol Tp | pointer to first tolerance which references feature |
| | Next Feat Ptr | pointer to next feature on component |
| Tolerance | Tolerance ID | ID used to access tolerance db information |
| | Info Slot | slot to hold arbitrary information |
| | First Tol Feat Fp | pointer to first feature affected by tolerance |

TABLE I-continued

DESCRIPTION OF LINKED LISTS

| List | Contents | Description |
|------|----------|-------------|
|      | DRF Ptr | pointer to DRF which contains datum information |
|      | Tol DOF | Degrees of Freedom table for tolerance |
|      | Valid Flag | FALSE if this tolerance is invalid |
|      | Next Tol Ptr | pointer to next tolerance in FCN |
| DRF  | DRF ID | ID used to access DAF db information |
|      | Info Slot | slot to hold arbitrary information |
|      | First Datum Feat Fp | pointer to first (primary) datum feature in DRF |
|      | First Sec Datum Fp | pointer to first secondary datum feature in DRF |
|      | First Tert Datum Fp | pointer to first tertiary datum feature in DRF |
|      | Datum Ref Frame | Datum feature's reference frame |
|      | Datum DOF | Datum Degrees of Freedom Table |
|      | Next DRF ptr | pointer to next DRF in FCN |
| Fp   | Feat Ptr | pointer into feature list |
|      | Modifier | modifier for toleranced and datum features |
|      | Info Slot | slot to hold arbitrary information |
|      | Next FP Ptr | next Fp node |
| Tp   | Tol Ptr | pointer into tolerance list |
|      | Mapped DRF DOF | DRF DOF mapped to specific feature's reference frame |
|      | Info Slot | slot for holding arbitrary information |
|      | Next TP Ptr | next tp node |

Figure 4:
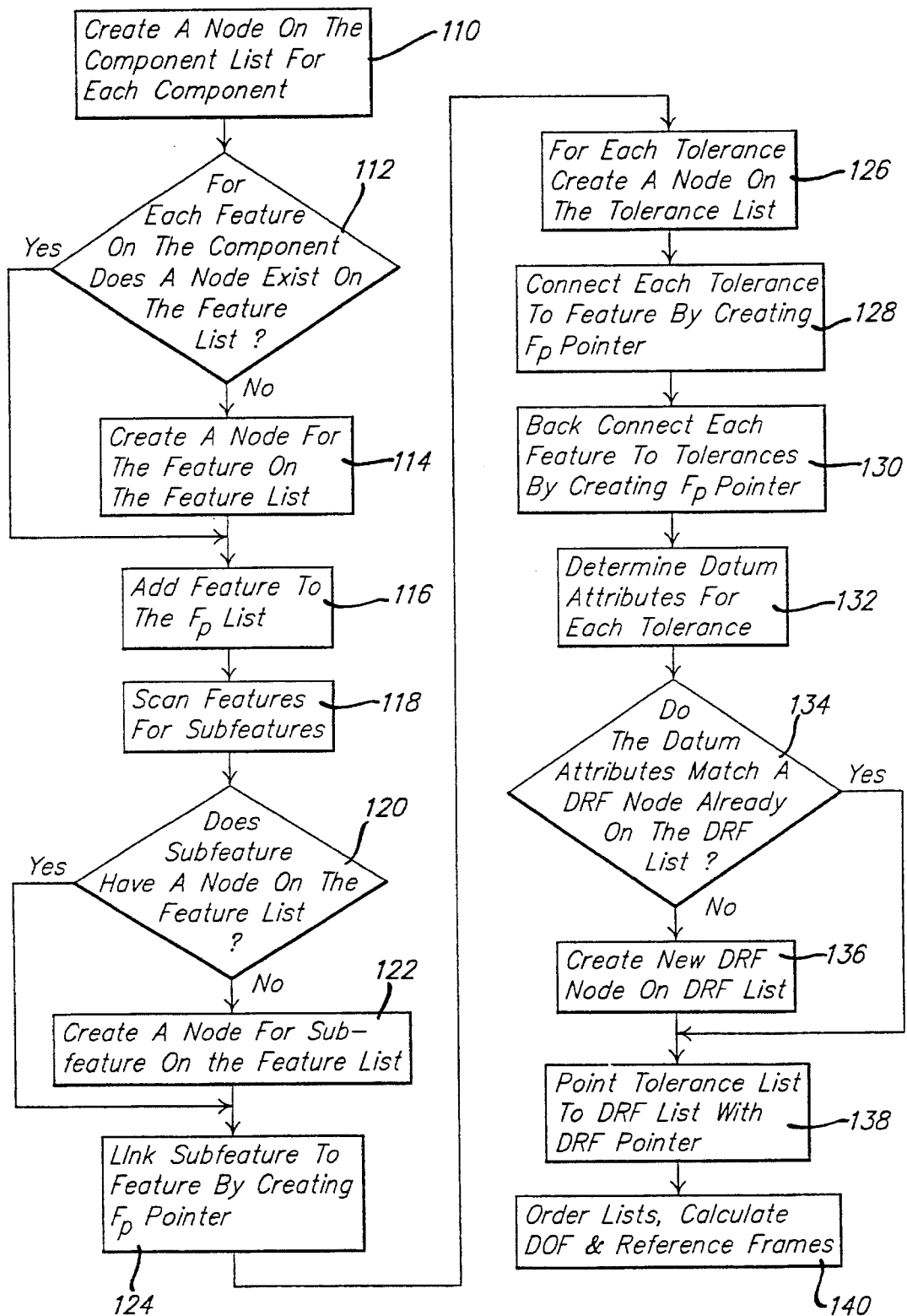
FIG. 4 is a flow chart illustrating the construction of the feature constraint network of the present invention.

The following discussion, with reference to FIG. 4, describes the steps for building data structure 26 and thereby creating the FCN. First, for each component to be included in the FCN, a component node is created and added to the list of components 110. The components are arbitrarily ordered alphabetically. All pointers to the feature and DRF lists are defaulted to NULL.

Next, for each of the features on a component, a check is made to determine if the feature already exists in the feature list 112. A feature may be repeated in the list if it consists of subfeatures on multiple components and the feature exists on every component that the subfeatures exist on. If the feature does not already exist, a feature node is created for it and added to the feature list 114. Like components, features are arbitrarily ordered alphabetically. The feature DOF and reference frame values are set at a later time. The pointers to the tolerance and subfeature lists are set to NULL, the subfeature pointers being set after all of the features are entered into the list. The feature is then added to the Fp list of features on the component 116.

Once all of the components and features have been processed in the FCN, the feature list is traversed to find any features which also list subfeatures 118. When such a feature is encountered, the feature is connected to all of its subfeatures by way of the Fp list 124. If a subfeature exists that does not exist in the feature list 120, it is created and added to the feature list like any other feature 122. This does imply that the feature is not part of any component in the FCN. The ordering of the subfeatures is arbitrary, and only one level of processing of subfeatures is required for each feature since processing all subfeatures necessarily results in the processing of multilevel subfeatures.

With all components and features established in the FCN, the tolerances can be processed. For each tolerance in the FCN, a tolerance node is created and added to the tolerance list 126. The tolerances are also arbitrarily ordered alphabetically. Next each feature affected by a tolerance is identified, and the tolerance is connected to the feature by creating a Tp node to each feature list 128. Each feature is then "back" connected to the tolerance by an entry to the Fp list 130. If a feature is specified which is not listed on the feature list, a new feature node is created in the FCN feature list for it. The DOF in the tolerance list is then set to the default value.

Datum attributes for each of the tolerances are then determined 132. These attributes include any datum modifiers specified. If the attributes precisely match those in an existing DRF node in the DRF list 134, then the tolerance is pointed to that DRF 138. If no matching DRF is found, a new DRF node is created 136. The order of the stored DRF nodes is arbitrary, the primary, secondary and tertiary datum features and modifiers are stored in the DRF node via an Fp list.

With all component, feature and tolerance information loaded into the FCN from the CAD system, the next step is ordering several of the FCN lists and calculating DOF and reference frames 140. Specifically, the feature DOF table, feature reference frame, tolerance DOF, datum reference frame, and datum DOF table are calculated and the list of features on a component and list of tolerances on a feature are ordered.

The data structure builder 22 includes DOF information generator 24 which supplies the DOF information contained in data structure 26. DOF generator 24 functions to retrieve DOF information for features, tolerances or DRFs from the library 20 in a look up mode, or to perform other functions required to determine feature, tolerance or DRF DOF. For example, the DOF for each feature can be determined based upon feature type. A feature of dimension d0 are controlled in translation in the "x" direction (Tx), Ty, and Tz; each feature of dimension d1 is controlled in Tx, Ty, rotation in the "x" direction (Rx), and Ry; and each feature of dimension d2 is controlled in Tz, Rx and Ry. A tolerance DOF can be determined based upon class. Location tolerances are controlled in Tx, Ty and Tz; orientation tolerances are controlled in Rx, Ry and Rz; and form or size tolerances are not controlled in any degree of freedom. The DOF generator, therefore, identifies the feature type or tolerance class and from this information looks up the particular feature or tolerance DOF.

The datum reference frame for each datum reference frame node is determined. Since tolerances share DRF nodes, each tolerance in the FCN is checked. If a tolerance is encountered for which a DRF has not been calculated, the datum reference frame information is retrieved from the CAD database, and the information is stored in a DRF node.

The features on the component are then ordered. The order that the datum features provided by the CAD system is significant, and the DRF features are stored in that order. Primary datum features A–B will be deemed unique from B–A and stored as such. If a datum feature cannot be found in the feature list, it will be added. The DOF and reference frame stored in the DRF node are set to default values. A DRF may possibly contain only primary or primary and secondary datum features in which case datums pointers will be NULL and modifiers will be arbitrary. Also, it is possible that a DRF may not contain any datums. This would be the case when a feature is assigned only size or form tolerances. In this case no DRF is created and the tolerance's DRF pointer is NULL. The list is also ordered such that a datum feature is not encountered until after all datum features it depends upon have been encountered. Since non-datum features relate only to datum features, they may be ordered arbitrarily and in the preferred embodiment are ordered alphabetically.

In the preferred embodiment, the datum features are ordered based on a least "out degrees of freedom" first criteria. Out DOF specifies the number of other datum features this datum feature is dependent upon. If two or more datum features have the same out DOF, the next ordering criteria is the datum identifier letter. For example, datum feature "A" before datum feature "C". A blank datum letter comes last. Finally, if for some reason datum letters are identical, ordering is alphabetical based upon datum feature name. Once the single highest ranking datum feature is determined, it is moved to the top of the list. The process is repeated with all remaining datum features, ignoring the already ordered datum features. Ignoring a datum feature means that there is no out DOF dependence upon it. It is important to emphasize that only a single datum feature is deemed highest ranking in each step, even if multiple features have the same out DOF. The act of ranking the datum feature and then ignoring it changes the out DOF of all remaining features and could potentially change the order of the datum features.

The next step is to order the tolerances on a feature. Tolerances are ordered first by class. Ordering is by size, form, orientation, and then location. Within a particular class, ordering is then based upon whether the primary, secondary, or tertiary axes contain features. For example, a tolerance with specified primary, secondary and tertiary datums is ordered before a tolerance with only primary and secondary datums. Zone values is the next ordering criteria with tolerances having smaller zone values preceding tolerances with larger zone values. For identical zone values, considerations is given to any zone modifiers in the following order: regardless of feature size (RFS), maximum material condition (MMC), the least material condition (LMC). Finally, tolerances are ordered alphabetically by the indicated datum feature letters to break any ties.

After ordering the tolerances, the feature reference frame is calculated for each of the component features. In this process, the datum reference frame and the DOF information is also determined for any tolerances on the features.

The next step is to determine the DOF table for each DRF node in the FCN. The DOF information generator 24 performs this function, and the datum DOF table is determined by mapping each datum feature's DOF table from its feature reference frame to the datum reference frame. The first primary datum feature is determined and its DOF table tells which axes are controlled in the feature's reference frame. These axes are mapped from the feature frame to the DRF. For example, if a datum feature is controlled along its "x" axis, that feature "x" axis may actually be the datum reference frame's "z" axis, and therefore, the datum reference frame's DOF is controlled along the "z" axis. The secondary and tertiary features are then used to further refine the datum reference frame DOF as indicated in Table II.

TABLE II

DATUM REFERENCE FRAME COMBINATIONS

| PRIMARY DATUM (A) | SECONDARY DATUM (B) | TERTIARY DATUM (C) | FREE DOF | LIMITATIONS |
|---|---|---|---|---|
| POINT | — | — | U, V, W | — |
|  | POINT | — | W | (A) ≠ (B) |
|  |  | POINT | — | C ⊄ {LINE (A – B)} |
|  |  | LINE | — | C ≠ {LINE (A – B)} |
|  |  | PLANE | — | C NOT ⊥ {LINE (A – B)} |
|  | LINE (A ⊂ B) | — | W | — |
|  |  | POINT | — | C ⊄ B |
|  |  | LINE | — | C ≠ B |
|  |  | PLANE | — | C NOT ⊥ B |
|  | LINE (A ⊄ B) | — | — | — |
|  | PLANE | — | W | — |
|  |  | POINT | — | C ⊄ {LINE (A – B):LINE ⊥ B} |
|  |  | LINE | — | C NOT ∥ {LINE (A – B):LINE ⊥ B} |
|  |  | PLANE | — | C NOT ∥ B |
| LINE | — | — | W, Z | — |
|  | POINT (A ⊂ B) | — | W | — |
|  |  | POINT | — | C ⊄ A |
|  |  | LINE | — | C NOT ∥ A |
|  |  | PLANE | — | C NOT ⊥ A |
|  | POINT (B ⊄ A) | — | — | — |
|  | LINE (B ∥ A) | — | Z | B ≠ A |
|  |  | POINT | — | — |
|  |  | LINE | — | C NOT ∥ A |
|  |  | PLANE | — | C NOT ∥ A |

TABLE II-continued

DATUM REFERENCE FRAME COMBINATIONS

| PRIMARY DATUM (A) | SECONDARY DATUM (B) | TERTIARY DATUM (C) | FREE DOF | LIMITATIONS |
|---|---|---|---|---|
| PLANE | LINE (B NOT ∥ A) | — | — | — |
| | PLANE (B NOT ∥ A) | — | Z | INCLUDING A ⊂ B |
| | | POINT | — | — |
| | | LINE | — | C NOT ∥ A |
| | | PLANE | — | C NOT ∥ A |
| | PLANE (B ⊥ A) | — | W | — |
| | | POINT | — | C ⊄ A |
| | | LINE | — | C ≠ A |
| | | PLANE | — | C NOT ∥ A |
| | PLANE (B SKEW A) | — | — | (B NOT ∥ A & B NOT ⊥ A) |
| | — | — | W, X, Y | — |
| | POINT | — | W | — |
| | | POINT | — | C ⊄ {LINE (A − B):LINE ⊥ A} |
| | | LINE | — | C ≠ {LINE (A − B):LINE ⊥ A} |
| | | PLANE | — | C NOT ∥ A |
| | LINE (B ⊥ A) | — | W | — |
| | | POINT | — | C ⊄ B |
| | | LINE | — | C ≠ B |
| | | PLANE | — | C NOT ∥ A |
| | LINE (B ∥ A) | — | X | INCLUDING B ⊂ A |
| | | POINT | — | — |
| | | LINE | — | C NOT ∥ B |
| | | PLANE | — | C NOT ∥ B |
| | LINE (B SKEW A) | — | — | B NOT ∥ A & B NOT ⊥ A |
| | PLANE | — | X | B NOT ∥ A |
| | | POINT | — | — |
| | | LINE | — | C NOT ∥ (A ∩ B) |
| | | PLANE | — | C NOT ∥ (A ∩ B) |

Several of the steps in defining the FCN involve determining or referencing either the feature reference frame (FRF) or the datum reference frame (DRF). The FRF is a local coordinate system which is created from feature points and is used as a reference to apply location, orientation and relational tolerances, and the DRF is a coordinate system defined by the features referenced as the datum features in a tolerance callout. The feature reference frame is determined according to the following steps. First, the feature normal vector is defined as the "z" axis. Next, the dot product of the feature "z" axis is taken with each axis of a specified coordinate system (either the world coordinate system or a given datum reference frame). The coordinate system axis resulting in an absolute dot product value closest to 1.0 is identified. Next the cross product of the feature "z" axis is taken with the next (i.e., if the first identified axis is the "x" axis then the next axis is the "y" axis, if it is the "y" axis then the next axis is the "z" axis, and if it is the "z" axis, then the next axis is the "x" axis) coordinate system axis. The cross product produces the feature J axis. The feature "x" axis is found by crossing the feature axis with the feature "z" axis. The FRF origin is defined as the feature origin.

To determine which coordinate system to use to define a FRF, the tolerances on the feature are analyzed. If a tolerance only references datum features which have already been encountered in the feature list it is a valid tolerance. The datum reference frame referenced by the highest ranking (i.e., the highest ordered location or orientation tolerance) valid tolerance is used to determine the feature reference frame. If no such valid tolerance is found, the world coordinate system is used to determine the feature reference frame. Note that since derived features may exist on multiple components, its feature reference frame is based on the last component on which it was found.

As indicated above, the datum features are ordered within the feature list. The first feature in the list is the primary datum feature for the master reference frame. This feature may not have relational tolerances, and therefore does not reference any datum features. If the feature is of dimension d0, then the FRF is simply the world reference frame translated to the feature origin. If the primary datum feature is not of dimension d0, then the FRF is calculated as described above referencing the world reference frame. The FRFs for the remaining datum and non-datum features can then be calculated as described above.

Figure 5:
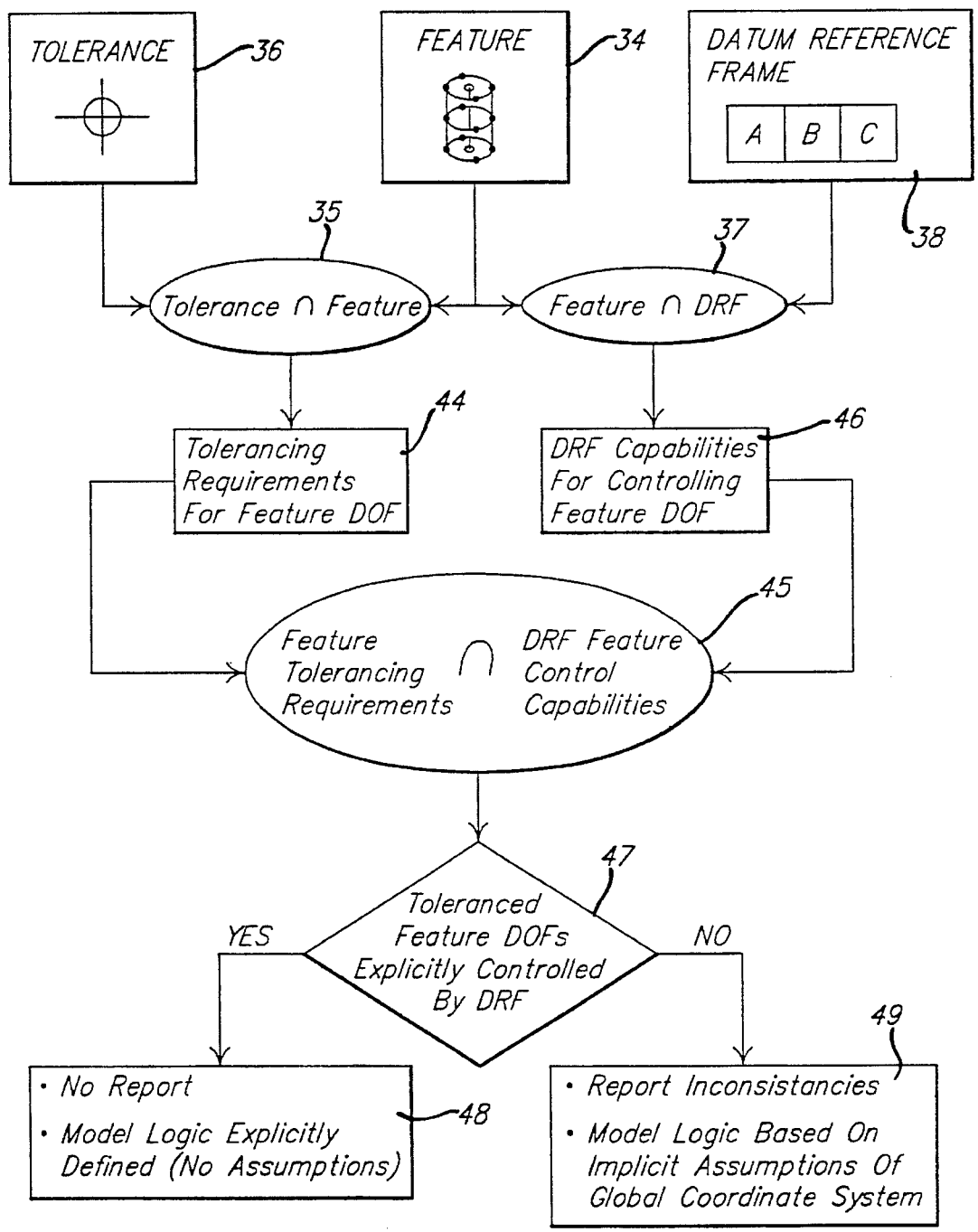
FIG. 5 is flow diagram illustrating the degrees of freedom testing of the present invention.

With reference to FIG. 5, the function of the DOF tester 28 will now be described. The feature data 34, tolerance data 36 and datum reference frame data 38 in data structure 26 defines the constraint and relaxation information for the features to be analyzed. For each of the features, the feature data 34 defines the geometry or constraints of the features of the component. The tolerance and DRF data 36 and 38, respectively, define how these constraints are to be relaxed. To determine if the constraining data is adequately relaxed, the DOF are analyzed. Each feature, possesses degrees of freedom which must be constrained and relaxed. That is, variation of particular constraint data effects the position, orientation, form, or size of a feature, whereas, variation of other constraint data will not effect these parameters. The tolerance and the DRF are capable of controlling particular feature DOF. The DOF tester 28 compares, as indicated at 35, 37, and 45, the feature DOF information and the tolerance and DRF DOF information to determine which of the feature DOF are, or can be, controlled by the tolerance definition and the datum reference frame.

If all of the possible degrees of freedom for a particular feature are, consistent with the tolerance rule set, controlled 48, then the tolerance plan for that feature is considered well defined, and a mathematical model of the tolerance plan for that feature can be generated based on the tolerance rule set and without assumptions. If after the comparisons are made, however, all of the possible degrees of freedom of the feature are not, consistent with the tolerance rule set, controlled 49, e.g., no tolerances or conflicting tolerances are assigned or an incomplete or undefined DRF is referenced, then the tolerance plan is not considered well defined. The DOF tester 28 warns the via the user interface 16. In this case, assumptions are required to generate a mathematical model of the tolerance representation.

In the preferred embodiment, the DOF tester 28 compares the DOF information on two levels. First, the DOF tester 28 compares the feature DOF and the DOF controlled by the tolerance definition by taking an intersection of the two sets as indicated at 35, with the result being the feature DOF 44 that can be controlled with the tolerance definition. The feature DOF and the tolerance DOF are dependent on the tolerance rules set being used, and the DOF are necessarily defined consistent with that tolerance rule set.

Next the DOF tester 28 compares the datum reference frame and the feature DOF, also by taking an intersection, 37. The result of this comparison is the DOF which can be controlled by the datum reference frame 46. The datum reference frame DOF are dependent on the number and type of features which make up the datum reference frame. Table II identifies, as implemented in the presently preferred embodiment and based upon the ANSI convention that datum precedence is important, the degrees of freedom controlled by the different datum reference frame combinations defined by point, line and plane features taken either singly or in combination.

The DOF tester 28 then compares the two results, 44 and 46 from steps 35 and 37, respectively, by taking an intersection 45. For the datum reference frame to be considered adequate to control all the DOF of the feature, all of the DOF contained in the comparison of the feature DOF to tolerance DOF must be contained in the set resulting from this comparison. If each of the possible DOF are not contained in this set as tested at 47, the datum reference frame is inadequate in that it can not control all of the feature DOF, or the tolerance type is incorrect to control the particular feature. For the overall tolerance plan to be considered adequate, all of the feature DOF must be addressed.

Figure 9:
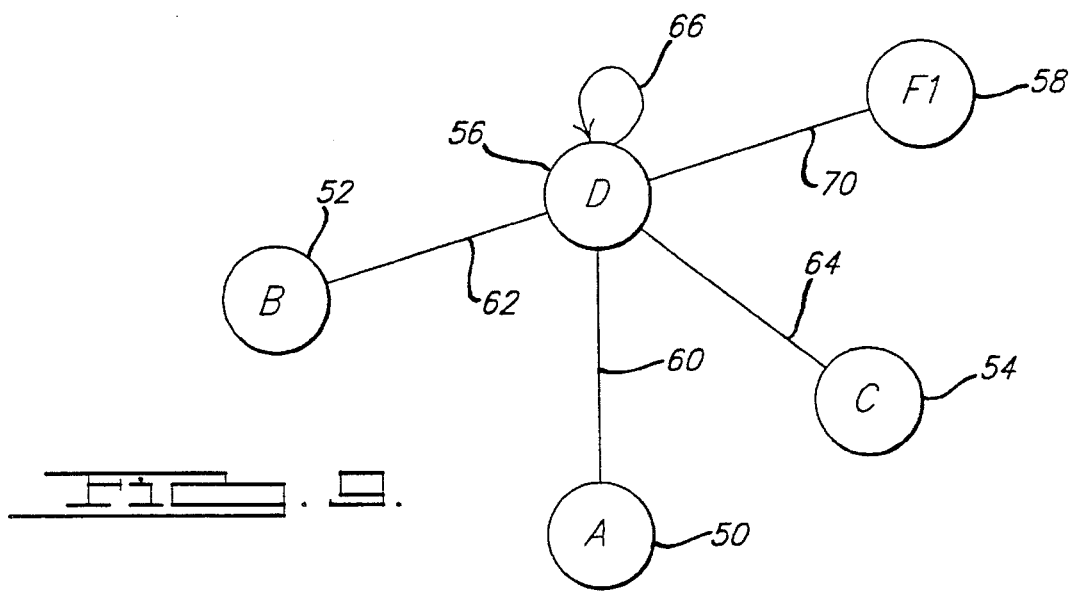
FIG. 9 is a graphical representation of a feature constraint network constructed from the tolerance information indicated for the block part shown in FIG. 2.

The foregoing describes the DOF tester 28 function which analyzes individual features with respect to the DOF which are intended to be and actually are controlled by a tolerance definition in relation to the defined datum reference frame and tolerance type. Next, the network tester 30 which analyzes interactions between multiple features, datums, and tolerances will be described. FIG. 9 shows graphically the Feature Constraint Network (FCN) for the block part of FIG. 2 Each of the features of the part, including the datum features are represented by a vertex one of which is shown at 50. The vertices are connected by edges illustrated for example at 60 which define the relationship of features to other features. For example, the edges 60, 62 and 64 describe the tolerance relationship of feature D 56 to datum features A, B, and C, 50, 52 and 54 respectively. These relationships are represented as Fp and Tp pointers between feature and tolerance nodes in data structure 26. Edge 66 indicates that the feature relates in some fashion back to itself and not to other features as can be seen from the fact that the edge loops back beginning and terminating at the same feature. Therefore, it can be seen that the edges represent tolerance relationships between features. Depending on how the vertices are connected by edges the FCN provides insight into the well formedness of the tolerancing plan.

During analysis of the FCN, the network tester 30 makes reference to the well formedness rule set 32 which contains the criteria by which the well formedness of the tolerancing plan is evaluated. The rule set 32, as implemented in the preferred embodiment, is set forth more fully in Table III. It will be appreciated, that one of ordinary skill in the art, given a particular tolerance rule set, may define other criteria upon which to base the determination of completeness and well formedness of the tolerance plan. The network tester 30 also functions, similar to the DOF tester 28 to generate warnings to the user via user interface 16 each time a condition indicating that the tolerance plan may not be well formed occurs.

With reference once again to FIG. 2, an illustrative part and tolerance plan is shown to assist, byway of example, the further description of the present invention. Shown in FIG. 3 is a part 72 which is a block 74 having a cylindrical bore or hole feature 76 extending through the top 78 and bottom 80 surface features of block 74. Additional features of block 74 include side features 82, 84, 86, and 88. As may be arbitrarily assigned by a designer, surface 80 has been designated datum feature A as indicated at 90. Likewise, surfaces 82 and 88 have been designated datum features B and C as indicated at 92 and 94, respectively. Datum features A, B and C, define the datum reference frame according to Table II for the example part. A coordinate system can also be defined corresponding to the datum reference frame and in cartesian coordinates, is indicated as X, Y, and Z in FIG. 2. The assignment of the coordinate system axes generally follow conventions established within the tolerance rule set.

Indicated at 96 is a tolerance for hole 76 which, in GD & T terminology, represents a positional tolerance for the axis of hole 76 relating to datum features A, B and C and defining a cylindrical tolerance zone of 1.0 mm. That is, the constraint defining the position of the axis of hole 76, is relaxed such that the axis of the hole may vary so long as it remains within a 1.0 mm cylindrical zone. Shown above tolerance 96 is a notation 98 which indicates the tolerance or allowable variation of the size of hole 76. Indicated below tolerance 96 is a further designation 100 indicating that hole 76 is also datum feature D. The tolerance plan also indicates a tolerance 102 for surface feature 78. Per the definitions provided by GD & T, the tolerance described defines the perpendicularity of the surface with respect to the datum reference frame constructed from datum feature D, which is the axis of hole 76. Thus, the foregoing describes and defines, for this example, several of the features of the component, and the tolerance plan for these feature as would be read from the CAD system.

Figure 7:
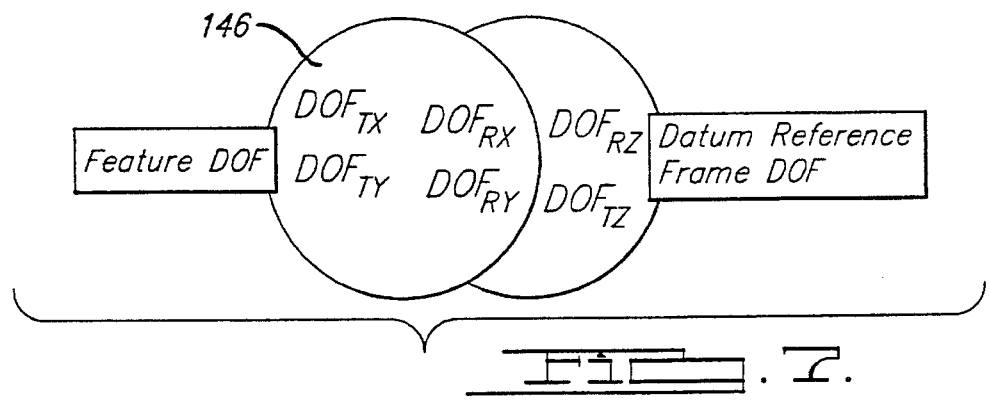
FIG. 7 is a schematic illustrating the interaction of features with the datum reference frame in constraining degrees of freedom.
Figure 8:
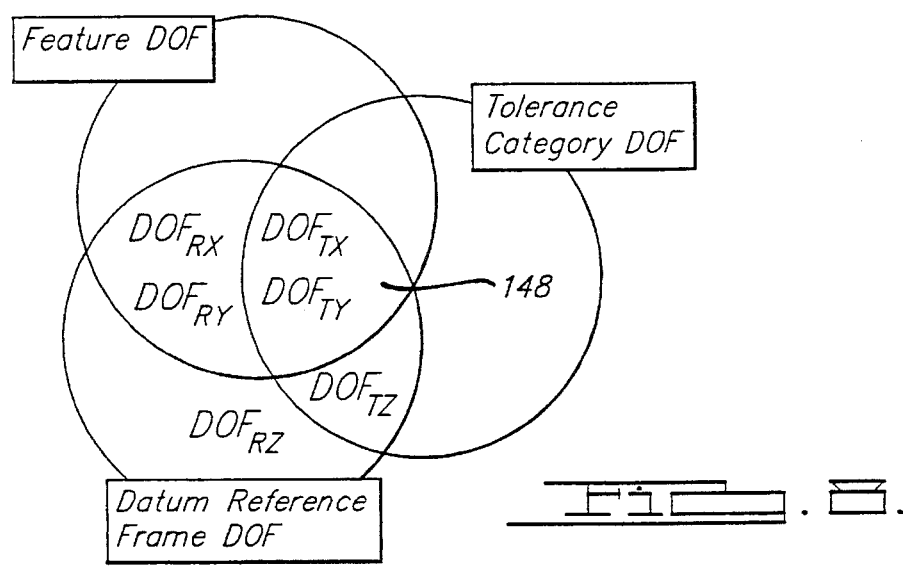
FIG. 8 is a schematic illustrating the interaction of features, tolerances and the datum reference frame in relaxing degrees of freedom.

As indicated at step 140 of the flow chart of FIG. 8 the DOF information generator 24 calculates the feature degrees of freedom for each feature. In the present example, according to the rules of GD & T, the degrees of freedom for hole 76 are translation along the X and Y axes indicated as DOFtx and DOFty in FIGS. 6–8, and rotation about the X and Y axes indicated as DOFrx and DOFry in FIGS. 6–8. Note that translation along the Z axis or rotation about the Z axis of hole 48 does not change the location or orientation of hole 76 and therefore are not considered as feature DOF which require constraint and tolerance relaxation. Because the feature DOF are defined relative to a feature reference frame, it will be appreciated that these DOF will necessarily need to be transformed such that they correspond to the world coordinate system in which the component is defined. The feature DOF are calculated for all features, but for illustrative purposes has only been done here for hole feature 76.

Next the DOF information generator 24 calculates the tolerance DOF. The tolerance DOF are those DOF defined by the tolerance rule set which are controlled by a particular tolerance designation. The tolerance DOF for the positional tolerance 96 on the hole 76 of part 72 are shown in FIG. 6, as Tolerance Category DOF, DOFtx, DOFty, DOFtz. This is because the positional tolerance may be interpreted as controlling the amount of variation in the location of the axis of the hole with respect to the datum reference frame. Thus, the positional tolerance controls translation along the X, Y and Z axes. Next, the DOF information generator 24 calculates the datum reference frame degrees of freedom.

In order to determine which degrees of freedom are not controlled by the tolerance designation, for all features, the DOF tester 28 takes the intersection of the feature DOF and the tolerance DOF. The result of this intersection in the example is shown at 144 of FIG. 6 and represents those feature DOF controlled by the tolerance designation.

In similar fashion, the DOF tester 28 compares the tolerance DOF are compared to the degrees of freedom controlled by the datum reference frame. The degrees of freedom controlled by the datum reference frame are determined based upon the datum features which define the datum reference frame and the tolerance rule set. For the three planes defined as the datum reference frame for the part of FIG. 3, the DOF controlled are translation along the X, Y and Z axes and rotation about these same axes when a rectangular coordinate system is used (Table II). Therefore, indicated in FIG. 7 as Datum Reference Frame DOF DOFtx, DOFty, DOFtz, DOFrx, DOFry and DOFrz indicating that all six spatial DOF can be controlled by the defined datum reference frame. The results of an intersection of this set with the feature degrees of freedom shown at 146 of FIG. 7 indicates and verifies that all DOF of hole 76 are capable of being explicitly controlled by the datum reference frame.

To ultimately determine which DOE of a given feature are controlled by the tolerance plan, the DOF tester 28 takes the intersection of the results of the intersection of the feature DOF and the tolerance DOF and the results of the feature DOF intersection with the datum reference frame degrees of freedom the results of which are shown at 148 in FIG. 8. The results indicate which feature DOF are actually controlled. In the present example, note that while the translational DOF for hole 76 are controlled, the rotational DOF, DOFrx and DOFry are not controlled. Absent other tolerance designations which would control these feature degrees of freedom, hole 76 of the present example is considered under-constrained, and in this example, a warning would be sent to the user.

It is important to reiterate that the feature degrees of freedom, the tolerance degrees of freedom and the degrees of freedom controlled by a particular datum reference frame are all dependent on the particular tolerance rule set being used. It is further possible to interpret a single tolerance rule set based upon the particular application to yield different degrees of freedom for the same feature type or tolerance. For example, and as is done in the preferred embodiment, it is possible, within limitations, to imply orientation tolerances from an assigned location tolerance. In this case, the location tolerance, while actually controlling translational degrees of freedom also controls, impliedly, the rotational degrees of freedom. This result is implied from the tolerance requirement that the axis of hole 76 lie within a 1.0 mm cylinder. Therefore, if the axis is tilted, it must still lie within this cylinder to satisfy the location tolerance requirement. For the present example, this would indicate that not only are the translational degrees of freedom controlled by the position tolerance on hole 76, but the rotational tolerances are also controlled. Thus, the determination as to whether or not the tolerance plan is well formed, depends on the interpretation given to the tolerance types. A unique feature of the present invention is that it is adaptable to accept any interpretation of the tolerance rule set. Once the degrees of freedom are defined for feature and tolerance types and implemented into the library, the designer has available a tool which provides consistent, unambiguous evaluations of the tolerance plans.

Depending on the results of the DOF analysis, several conclusions can be drawn regarding whether or not a particular tolerance plan is well defined. Similar to the interpretations given tolerance and feature types with respect to degrees of freedom, whether a tolerance plan is considered well formed is dependent on the tolerance rule set. Each of the possible conditions relating to the adequacy of the tolerance plan under the degree of freedom analysis for individual features are tested. When a condition occurs which suggests that the tolerance plan is not adequate a warning is sent to the user via user interface 16 so that corrective action may be taken.

With reference once again to FIG. 7, a representative feature constraint network (FCN) for part 72 is shown. Indicated are vertices for features: datum surface A at 50, datum surface B at 52, datum surface C at 54, hole feature 76 designated datum feature D at 56, and surface feature 78 designated F1 at 58. While there are other features which would be represented in the FCN, for purposes of example only the above features are considered. Each feature is connected by edges. The tolerance relationship of hole 76 to datums A, B, and C is represented by edges 60, 62 and 64, respectively. Also the tolerance relationship of surface feature 78 to hole feature 76 is shown by edge 70. Each of these edges, which begin at a first vertex and terminate at a second vertex are known as directed links. Edge 66 indicates the size tolerance for hole feature 76. That is, the tolerance relates to the feature itself and not to other features, this type of edge is known as a directed loop.

The network tester 30 analyzes the FCN using the well formedness rule set 32 to provide insight into the well formedness of the tolerance plan. For example, the tolerance on hole feature 76 properly relates back to the datum reference frame as indicated by edges 60, 62 and 64 connecting to vertices 50, 52 and 54, respectively. Note, however, that there are no links between datum features A, B, and C. This indicates that there is no defined tolerance relationship between these surfaces which causes the network tester 30 to generate a warning. Also note that edge 70, terminates at hole feature 76, vertex 56. This indicates that the surface feature 78 does not relate directly back to the datum reference frame defined by surface features A, B and C, but to hole feature 76 via tolerance 102. Hole feature 76 has been designated datum feature D 100 (FIG. 3), however, if hole feature 76 was not designated datum feature D, the network tester 30 would identify this condition and generate a warning that the tolerance plan is not well formed in that edges may only terminate at a datum feature. The relation of surface 78 to hole 76, designated datum D, however, does indirectly relate surface feature 78 to the datum reference frame defined by datum features A, B and C. The FCN also suggests that datum features A, B and C define the master datum reference frame, i.e., the datum reference frame to which all features, datum feature or otherwise, must eventually be related.

While the specific embodiment of the invention has been shown and described in detail to illustrate the principles of the present invention, it will be understood that the invention may be embodied otherwise without departing from such principles. For example, one skilled in the art will readily recognize from such discussion and from the accompanying drawings and claims that various changes, modifications and variations can be made therein without departing from the spirit and scope of the invention as described in the following claims.

What is claimed is:

1. A computer-aided engineering and design system for evaluating the correctness of an engineering design, comprising:

an interface for coupling to a computer-aided engineering and design system;

a computer-implemented data storing system for creating a data structure that includes:
(a) a feature data structure for storing a representation of a geometric physical feature of the engineering design;
(b) a tolerance data structure associated with said feature data structure for storing tolerance information about said physical feature;
(c) a datum reference frame data structure for storing a representation of a geometric datum reference frame;

said computer-implemented system further creating a design data structure for storing a representation of said engineering design as follows:
(d) said design data structure defining a relationship among a plurality of physical features represented in said feature data structure;
(e) said design data structure defining a relationship between said geometric datum reference frame and said plurality of physical features;

a computer-implemented design evaluating system including a feature constraint network analyzer for accessing said design data structure and for evaluating said relationships among said plurality of physical features to build a network data structure for storing information indicative of whether each of said plurality of physical features is related to said reference frame without ambiguity:

said design evaluating system having rule-based analysis system that defines a plurality of different feature types and a plurality of different tolerance types;

said design evaluating system determining, for each physical feature represented in said feature data structure, a first set of degree-off-freedom data identifying which degrees of freedom are constrained and unconstrained for said physical feature according to feature type;

said design evaluating system determining, for each physical feature having associated tolerance information stored in said tolerance data structure, a second set of degree-of-freedom data identifying which degrees of freedom are constrained and unconstrained for said tolerance information according to tolerance type;

said design evaluating system determining, for each physical feature, a third set of degree-of-freedom data identifying which degrees of freedom are constrained and unconstrained based on information stored in said datum reference frame structure;

said design evaluating system forming the intersection of said first, second and third degree-of-freedom data to evaluate whether said engineering design is correct.

2. The computer aided engineering and design system of claim 1 further comprising:
means for generating a warning signal if the feature data and tolerance data are not properly linked.

3. The computer aided engineering and design system of claim 1 wherein said engineering design data comprises computer aided design data.

4. The computer aided engineering and design system of claim 1 further comprising degree of freedom information generator includes a look up list of degrees of freedom information for the feature data and the tolerance data.

5. A computer-aided engineering and design system for evaluating the completeness of an engineering design, comprising:

an interface for coupling to a computer-aided engineering and design system;

a computer-implemented data storing system for creating a data structure that includes:
(a) a feature data structure for storing a representation of a physical feature of the engineering design;
(b) a tolerance data structure associated with said feature data structure for storing tolerance information about said physical feature;
(c) a datum reference frame data structure for storing a representation of a geometric datum reference frame;

said computer-implemented system further creating a design data structure for storing a representation of said engineering design as follows:
(d) said design data structure defining a relationship among a plurality of physical features represented in said feature data structure;
(e) said design data structure defining a relationship between said geometric datum reference frame and said plurality of physical features;

a computer-implemented completeness evaluating system including a stored database of degree of freedom information associated with a plurality of different types of physical features, said completeness evaluating system accessing said design data structure and said stored database to determine the degrees of freedom associated with each of said plurality of physical features, said completeness evaluating system evaluating said plurality of physical features to determine whether all degrees of freedom associated with each of said plurality of physical features are constrained;

said completeness evaluating system having rule-based analysis system that defines a plurality of different feature types and a plurality of different tolerance types;

said completeness evaluating system determining, for each physical feature represented in said feature data structure, a first set of degree-of-freedom data identifying which degrees of freedom are constrained and unconstrained for said physical feature according to said physical feature's feature type;

said completeness evaluating system determining, for each physical feature having associated tolerance information stored in said tolerance data structure, a second set of degree-of-freedom data identifying which degrees of freedom are constrained and unconstrained for said tolerance information according to tolerance type;

said completeness evaluating system determining, for each physical feature, a third set of degree-of-freedom data identifying which degrees of freedom are constrained and unconstrained based on said datums reference frame structure;

said completeness evaluating system forming the intersection of said first, second and third degree-of-freedom data to evaluate whether said engineering design is well formed.

6. The computer aided engineering and design system of claim 5 wherein said engineering design data comprises computer aided design data.

7. The computer aided engineering and design system of claim 5 wherein said database of degree of freedom information generator includes a look up list of degrees of freedom information for the feature data and the tolerance data.

8. A method of evaluating feature constraints represented as dimensions and tolerances comprises:

a) defining a plurality of features with constraining data;

b) linking relaxation data to each feature defining a relaxation of the constraining data;

c) analyzing the constraining data so linked to determine whether each feature so defined by constraining data is relaxed.

9. The method of claim 8 wherein said step of analyzing further comprises identifying constraining data which is not adequately relaxed.

10. The method of claim 8 wherein said step of analyzing further comprises identifying constraining data which has linked thereto conflicting relaxation data.

11. The method of claim 8 wherein said step of analyzing further comprises identifying constraining data which is properly relaxed.

12. The method of claim 8 further comprising the step of using relaxation data to link features.

13. The method of claim 12 further comprising the step of analyzing the linked features to determine if the relaxation data adequately links the features.

14. The method of claim 13 wherein said step of analyzing comprises identifying features not linked to any other feature.

15. The method of claim 13 wherein said step of analyzing comprises identifying features which are redundantly linked to other features.

16. The method of claim 13 wherein said step of analyzing comprises identifying features to which other features are linked but which is not linked to other features.

17. The method of claim 13 wherein said step of analyzing comprises identifying features to which other features are linked and which is linked to other features.

18. The method of claim 13 wherein said step of analyzing comprises identifying features which are linked to themselves.

19. A method for evaluating feature constraints represented by dimensions and tolerances on a manufactured part comprises:

a) defining a plurality of features with constraining data;

b) linking relaxation data to each feature defining a relaxation of the constraining data;

c) identifying for each feature degrees of freedom;

e) defining a reference frame;

f) identifying degrees of freedom controlled by said reference frame; and g) analyzing the constraint data to determine whether each constraint is adequately relaxed.

20. The method of claim 19 wherein said step of analyzing comprises comparing the relaxation data to the feature degrees of freedom.

21. The method of claim 20 wherein said step of analyzing further comprises comparing the feature degrees of freedom to the degrees of freedom controlled by the datum reference frame.

22. The method of claim 20 wherein said step of analyzing further comprises comparing the tolerance degrees of freedom to the degrees of freedom controlled by the datum reference frame.

23. The method of claim 22 wherein said step of analyzing further comprises comparing the results of said comparison of relaxation data with the feature degrees of freedom with the results of said comparison of feature degrees of freedom with said degrees of freedom controlled by the datum reference frame.

24. The method of claim 23 wherein said step of comparing comprises taking an intersection.

25. The method of claim 23 further comprising the step of providing a warning when said constraining data is not adequately relaxed.

26. The method of claim 19 further comprising the step of using relaxation data to link features.

27. The method of claim 25 further comprising the step of analyzing the linked features to determine if the relaxation data adequately links the features.

\* \* \* \* \*